United States Patent
Ho et al.

(10) Patent No.: US 10,557,060 B2
(45) Date of Patent: Feb. 11, 2020

(54) METHOD OF CHEMICAL MECHANICAL POLISHING A SUBSTRATE

(71) Applicant: Rohm and Haas Electronic Materials CMP Holdings, Inc., Newark, DE (US)

(72) Inventors: Lin-Chen Ho, Taichung (TW);
Wei-Wen Tsai, Taipei (TW);
Cheng-Ping Lee, Miaoli County (TW);
Jiun-Fang Wang, Hsinchu (TW)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/080,489

(22) PCT Filed: Mar. 1, 2016

(86) PCT No.: PCT/CN2016/075071
§ 371 (c)(1),
(2) Date: Aug. 28, 2018

(87) PCT Pub. No.: WO2017/147768
PCT Pub. Date: Sep. 8, 2017

(65) Prior Publication Data
US 2019/0023944 A1    Jan. 24, 2019

(51) Int. Cl.
| | | |
|---|---|---|
| *C09G 1/02* | (2006.01) | |
| *H01L 21/302* | (2006.01) | |
| *B24B 1/00* | (2006.01) | |
| *C09K 3/14* | (2006.01) | |
| *H01L 21/321* | (2006.01) | |
| *B24B 37/04* | (2012.01) | |

(52) U.S. Cl.
CPC .............. *C09G 1/02* (2013.01); *C09K 3/1463* (2013.01); *H01L 21/3212* (2013.01); *B24B 37/044* (2013.01)

(58) Field of Classification Search
None
See application file for complete search history.

(56) References Cited

U.S. PATENT DOCUMENTS

| 7,247,566 | B2 | 7/2007 | Carter et al. | |
|---|---|---|---|---|
| 7,820,068 | B2 * | 10/2010 | Wang | C09G 1/02 252/79.1 |
| 2003/0040188 | A1 * | 2/2003 | Hsu | H01L 21/3212 438/697 |
| 2006/0117667 | A1 * | 6/2006 | Siddiqui | C03C 19/00 51/309 |
| 2007/0157524 | A1 * | 7/2007 | Lortz | C09G 1/02 51/298 |
| 2007/0181534 | A1 | 8/2007 | Kamimura | |
| 2011/0009033 | A1 | 1/2011 | Tanaka et al. | |
| 2011/0039475 | A1 * | 2/2011 | Hoshi | B24B 37/044 451/28 |
| 2014/0273458 | A1 | 9/2014 | Shi et al. | |
| 2015/0104941 | A1 * | 4/2015 | Graham | C09G 1/02 438/693 |
| 2015/0376462 | A1 * | 12/2015 | Fu | C09G 1/02 438/693 |
| 2017/0121560 | A1 * | 5/2017 | Dockery | B24B 37/24 |

* cited by examiner

*Primary Examiner* — Shamim Ahmed
(74) *Attorney, Agent, or Firm* — Thomas S. Deibert; John J. Piskorski

(57) ABSTRACT

A process for chemical mechanical polishing a substrate containing tungsten and titanium is provided comprising: providing the substrate; providing a polishing composition, containing, as initial components: water; an oxidizing agent; an allylamine additive; a carboxylic acid; a source of iron ions; a colloidal silica abrasive with a positive surface charge; and, optionally pH adjusting agent; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein the tungsten (W) is selectively polished away from the substrate relative to the titanium (Ti).

10 Claims, No Drawings

METHOD OF CHEMICAL MECHANICAL POLISHING A SUBSTRATE

The present invention relates to the field of chemical mechanical polishing. In particular, the present invention is directed to a process for chemical mechanical polishing a substrate containing tungsten and titanium, comprising: providing the substrate; providing a polishing composition, containing, as initial components: water; an oxidizing agent; an allylamine additive; a carboxylic acid; a source of iron ions; a colloidal silica abrasive with a positive surface charge; and, optionally pH adjusting agent; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the tungsten (W) and some of the titanium (Ti) is polished away with a removal selectivity for tungsten (W) relative to titanium (Ti).

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Chemical mechanical polishing has become a preferred method for polishing tungsten during the formation of tungsten interconnects and contact plugs in integrated circuit designs. Tungsten is frequently used in integrated circuit designs for contact/via plugs. Typically, a contact or via hole is formed through a dielectric layer on a substrate to expose regions of an underlying component (for example, a first level metallization or interconnect). Titanium (Ti) is often applied as a glue layer on the sides and bottom of the contact or via hole before deposition of tungsten. The tungsten overburden and titanium glue layer are subsequently polished down to provide a coplanar surface with the dielectric.

Another application for tungsten in integrated circuit designs is as local interconnects forming conductive lines between features on the same device level. One approach to forming local interconnects relies on Damascene processing. A first metal is inlaid into the lowest dielectric layer (ILDO). This involves first depositing ILDO, then patterning and etching recessed trenches in the dielectric. Typically, followed by the formation of a layered structure within the recessed trenches consisting of titanium and tungsten deposited into the trenches and over the dielectric surfaces, with the titanium interposed between the tungsten and the dielectric. Chemical mechanical polishing is then used to remove the titanium and tungsten down to the dielectric surface, leaving tungsten lines in the trenches to function as local interconnects. For chemical mechanical polishing to work for this application, all conductive residues of tungsten and titanium must be removed from the surface of the dielectric to prevent device shorting. The next process step following the chemical mechanical polishing is the deposition of the next level dielectric. Hence, the failure to remove the tungsten and titanium from the lower level dielectric layer would leave buried shorts in the device produced.

Conventional all chemical mechanical polishing strategies have been less than ideal for desirable tungsten feature formation. Various defectivity issues have plagued the all chemical mechanical polishing approach. For example, ideal polishing rate profiles for various materials required have been illusive.

As a result, various alternative strategies have been devised for use in the formation of both intra-level and inter-level tungsten interconnects in semiconductor substrates. For example, in U.S. Pat. No. 6,211,087, Gabriel et al. provide a two part strategy. In particular, Gabriel et al. teach a process for planarizing a substrate wherein a tungsten layer has been deposited over a titanium glue layer within holes or trenches formed in the substrate. First, a chemical mechanical polishing step is performed using a polishing slurry that selectively removes tungsten relative to the titanium glue layer to remove the tungsten overburden. Then, a chemical etching step is performed using a chemical wet etchant that selectively targets the titanium glue layer to facilitate an etch back to the dielectric.

Notwithstanding, there remains a continuing need for new chemical mechanical polishing compositions for use in the formation of both intra-level and inter-level tungsten interconnects in semiconductor substrates for use with alternative processing strategies such as those taught in U.S. Pat. No. 6,211,087, wherein the chemical mechanical polishing composition provides for the selective removal of tungsten relative to titanium.

The present invention provides a method of polishing a substrate, comprising: providing the substrate, wherein the substrate comprises tungsten (W) and titanium (Ti); providing a chemical mechanical polishing composition, comprising, as initial components: water; an oxidizing agent; an allylamine additive selected from the group consisting of poly(allylamine hydrochloride) and poly(allylamine); a colloidal silica abrasive having a permanent positive surface charge; a carboxylic acid; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten (W) is polished away from the substrate at a tungsten (W) removal rate; wherein at least some of the titanium (Ti) is polished away from the substrate at a titanium (Ti) removal rate; wherein the chemical mechanical polishing composition provided has a removal rate selectivity for the tungsten (W) versus the titanium (Ti); and, wherein the tungsten (W) removal rate is ≥35 times higher than the titanium (Ti) removal rate.

The present invention provides a method of polishing a substrate, comprising: providing the substrate, wherein the substrate comprises tungsten (W) and titanium (Ti); providing a chemical mechanical polishing composition, comprising, as initial components: water; 0.01 to 10 wt % of an oxidizing agent, wherein the oxidizing agent is hydrogen peroxide; an allylamine additive, wherein the allylamine additive is poly(allylamine hydrochloride) and wherein the mass ratio of the colloidal silica abrasive to the allylamine additive is ≥100; 0.01 to 10 wt % of a colloidal silica abrasive having a permanent positive surface charge; 500 to 5,000 ppm by mass of a carboxylic acid, wherein the carboxylic acid is propanedioic acid; 100 to 1,000 ppm by mass of a source of iron (III) ions, wherein the source of iron (III) ions is ferric nitrate nonahydrate; and, optionally, a pH adjusting agent; wherein the chemical mechanical polishing composition has a pH of 1 to 6; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten (W) is polished away from the substrate at a tungsten (W) removal rate; wherein at least some of the titanium (Ti) is polished away from the substrate at a titanium (Ti) removal rate; wherein the chemical mechanical polishing composition provided has a removal rate selectivity for the tungsten (W) versus the titanium (Ti); and, wherein the tungsten (W) removal rate is ≥35 times higher than the titanium (Ti) removal rate.

The present invention provides a method of polishing a substrate, comprising: providing the substrate, wherein the substrate comprises tungsten (W) and titanium (Ti); providing a chemical mechanical polishing composition, comprising, as initial components: water; 0.01 to 10 wt % of an oxidizing agent, wherein the oxidizing agent is hydrogen peroxide; an allylamine additive, wherein the allylamine additive is poly(allylamine) and wherein the mass ratio of the colloidal silica abrasive to the allylamine additive is ≥150; 0.01 to 10 wt % of a colloidal silica abrasive having a permanent positive surface charge; 500 to 5,000 ppm by mass of a carboxylic acid, wherein the carboxylic acid is propanedioic acid; 100 to 1,000 ppm by mass of a source of iron (III) ions, wherein the source of iron (III) ions is ferric nitrate nonahydrate; and, optionally, a pH adjusting agent; wherein the chemical mechanical polishing composition has a pH of 1 to 4; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten (W) is polished away from the substrate at a tungsten (W) removal rate; wherein at least some of the titanium (Ti) is polished away from the substrate at a titanium (Ti) removal rate; wherein the chemical mechanical polishing composition provided has a removal rate selectivity for the tungsten (W) versus the titanium (Ti); and, wherein the tungsten (W) removal rate is ≥35 times higher than the titanium (Ti) removal rate.

DETAILED DESCRIPTION

The method of polishing a substrate of the present invention uses a chemical mechanical polishing composition containing a synergistic combination of an allylamine additive selected from the group consisting of poly(allylamine hydrochloride) and poly(allylamine); an oxidizing agent; a carboxylic acid; and a colloidal silica abrasive having a permanent positive surface charge; and a source of iron (III) ions. It has been surprisingly found that the noted synergistic combination provides for the rapid removal of tungsten (W) while significantly retarding the removal of titanium (Ti) from the substrate surface during polishing.

Preferably, the method of polishing a substrate of the present invention, comprises: providing the substrate, wherein the substrate comprises tungsten (W) and titanium (Ti); providing a chemical mechanical polishing composition, comprising (preferably, consisting of), as initial components: water; (preferably, 0.01 to 10 wt %; more preferably, 0.1 to 5 wt %; most preferably, 1 to 3 wt %, of) an oxidizing agent; an allylamine additive selected from the group consisting of poly(allylamine hydrochloride) and poly(allylamine)(preferably, wherein the allylamine additive has a molecular weight of 5,000 to 100,000 Daltons; more preferably, 7,500 to 25,000 Daltons; most preferably, 10,000 to 20,000 Daltons); (preferably; 0.01 to 10 wt %; more preferably, 0.05 to 7.5 wt %; still more preferably, 0.1 to 5 wt %; most preferably, 0.2 to 2 wt %, of) a colloidal silica abrasive having a permanent positive surface charge; (preferably; 100 to 10,000 ppm by mass; more preferably, 500 to 5,000 ppm by mass; still more preferably, 750 to 2,500 ppm by mass; most preferably, 1,000 to 2,000 ppm by mass, of) a carboxylic acid (preferably, wherein the carboxylic acid is a dicarboxylic acid; more preferably, wherein the carboxylic acid is a dicarboxylic acid selected from the group consisting of propanedioic acid and 2-hydroxypropanedioic acid; most preferably, wherein the carboxylic acid is propanedioic acid); (preferably; 100 to 1,000 ppm by mass; more preferably, 150 to 750 ppm by mass; still more preferably, 200 to 500 ppm by mass; most preferably, 250 to 400 ppm by mass, of) a source of iron (III) ions (preferably, wherein the source of iron (III) ions is ferric nitrate nonahydrate); and, optionally, a pH adjusting agent; (preferably, wherein the chemical mechanical polishing composition has a pH of 1 to 6; more preferably, of 1 to 4; still more preferably, 1.5 to 3.5; most preferably, of 2 to 2.5); providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten (W) is polished away from the substrate at a tungsten (W) removal rate; wherein at least some of the titanium (Ti) is polished away from the substrate at a titanium (Ti) removal rate; wherein the chemical mechanical polishing composition provided has a removal rate selectivity for tungsten (W) versus titanium (Ti); and, wherein the tungsten (W) removal rate is ≥35 (preferably, ≥500; more preferably, ≥800; most preferably ≥1,000) times higher than the titanium (Ti) removal rate.

Preferably, in the method of polishing a substrate of the present invention, the substrate comprises tungsten and titanium. More preferably, the substrate provided is a semiconductor substrate comprising tungsten and titanium. Most preferably, the substrate provided is a semiconductor substrate comprising tungsten deposited within at least one of holes and trenches formed in a dielectric (e.g., TEOS), wherein titanium is interposed between the tungsten and the dielectric.

Preferably, in the method of polishing a substrate of the present invention, the water contained, as an initial component, in the chemical mechanical polishing composition provided is at least one of deionized and distilled to limit incidental impurities.

Preferably, in the method of polishing a substrate of the present invention, the chemical mechanical polishing composition provided contains, as an initial component, an oxidizing agent, wherein the oxidizing agent is selected from the group consisting of hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains, as an initial component, 0.01 to 10 wt % (more preferably, 0.1 to 5 wt %; most preferably, 1 to 3 wt %) of an oxidizing agent.

Preferably, in the method of polishing a substrate of the present invention, the chemical mechanical polishing composition provided contains, as an initial component, a source of iron (III) ions. More preferably, in the method of the present invention, the chemical mechanical polishing composition provided contains, as an initial component, a source of iron (III) ions, wherein the source of iron (III) ions is selected from the group consisting iron (III) salts. Most preferably, in the method of the present invention, the chemical mechanical polishing composition provided contains, as an initial component, a source of iron (III) ions, wherein the source of iron (III) ions is ferric nitrate nonahydrate, ($Fe(NO_3)_3 \cdot 9H_2O$).

Preferably, in the method of polishing a substrate of the present invention, the chemical mechanical polishing composition provided contains, as an initial component, a source of iron (III) ions sufficient to introduce 1 to 200 ppm by mass (preferably, 5 to 150 ppm by mass; more preferably, 7.5 to 125 ppm by mass; most preferably, 10 to 100 ppm by mass) of iron (III) ions to the chemical mechanical polishing composition.

Preferably, in the method of polishing a substrate of the present invention, the chemical mechanical polishing composition provided contains, as an initial component, a source of iron (III) ions. More preferably, in the method of polishing a substrate of the present invention, the chemical mechanical polishing composition provided contains, as an initial component, 100 to 1,000 ppm by mass (preferably, 150 to 750 ppm by mass; more preferably, 200 to 500 ppm by mass; most preferably, 250 to 400 ppm by mass) of a source of iron (III) ions. Most preferably, in the method of polishing a substrate of the present invention, the chemical mechanical polishing composition provided contains, as an initial component, 100 to 1,000 ppm by mass (preferably, 150 to 750 ppm by mass; more preferably, 200 to 500 ppm by mass; most preferably, 250 to 400 ppm by mass) of a source of iron (III) ions, wherein the source of iron (III) ions is ferric nitrate nonahydrate, ($Fe(NO_3)_3 \cdot 9H_2O$).

Preferably, in the method of polishing a substrate of the present invention, the chemical mechanical polishing composition provided contains, as an initial component, an allylamine additive selected from the group consisting of poly(allylamine hydrochloride) and poly(allylamine). More preferably, in the method of polishing a substrate of the present invention, the chemical mechanical polishing composition provided contains, as an initial component, an allylamine additive having a weight average molecular weight of 5,000 to 100,000 Daltons (more preferably, of 7,500 to 25,000 Daltons; most preferably, of 10,000 to 20,000 Daltons). Most preferably, in the method of polishing a substrate of the present invention, the chemical mechanical polishing composition provided contains, as an initial component, an allylamine additive selected from the group consisting of poly(allylamine hydrochloride) and poly(allylamine); wherein the allylamine additive has a weight average molecular weight of 5,000 to 100,000 Daltons (more preferably, of 7,500 to 25,000 Daltons; most preferably, of 10,000 to 20,000 Daltons).

Preferably, in the method of polishing a substrate of the present invention, the chemical mechanical polishing composition provided contains, as an initial component, an allylamine additive, wherein the allylamine additive is poly(allylamine hydrochloride). More preferably, in the method of polishing a substrate of the present invention, the chemical mechanical polishing composition provided contains, as an initial component, an allylamine additive, wherein the allylamine additive is poly(allylamine hydrochloride); and wherein the mass ratio of the colloidal silica abrasive to the allylamine additive is ≥100. Most preferably, in the method of polishing a substrate of the present invention, the chemical mechanical polishing composition provided contains, as an initial component, an allylamine additive, wherein the allylamine additive is poly(allylamine hydrochloride); and wherein the mass ratio of the colloidal silica abrasive to the allylamine additive is 100 to 500 (preferably, 100 to 300; more preferably, 100 to 250; most preferably, 100 to 200).

Preferably, in the method of polishing a substrate of the present invention, the chemical mechanical polishing composition provided contains, as an initial component, an allylamine additive, wherein the allylamine additive is poly(allylamine). More preferably, in the method of polishing a substrate of the present invention, the chemical mechanical polishing composition provided contains, as an initial component, an allylamine additive, wherein the allylamine additive is poly(allylamine); and wherein the mass ratio of the colloidal silica abrasive to the allylamine additive is ≥150. Most preferably, in the method of polishing a substrate of the present invention, the chemical mechanical polishing composition provided contains, as an initial component, an allylamine additive, wherein the allylamine additive is poly(allylamine); and wherein the mass ratio of the colloidal silica abrasive to the allylamine additive is 150 to 600 (preferably, 150 to 500; more preferably, 175 to 400; most preferably, 200 to 350).

Preferably, in the method of polishing a substrate of the present invention, the chemical mechanical polishing composition provided contains a colloidal silica abrasive having a permanent positive surface charge. More preferably, in the method of polishing a substrate of the present invention, the chemical mechanical polishing composition provided contains a colloidal silica abrasive having a permanent positive surface charge, wherein the chemical mechanical polishing composition has a pH of 1 to 6 (preferably, of 1 to 4; more preferably, of 1.5 to 3.5; still more preferably, of 1.75 to 3; most preferably, of 2 to 2.5). Still more preferably, in the method of polishing a substrate of the present invention, the chemical mechanical polishing composition provided contains a colloidal silica abrasive having a positive surface charge, wherein the chemical mechanical polishing composition has a pH of 1 to 6 (preferably, of 1 to 4; more preferably, of 1.5 to 3.5; still more preferably, of 1.75 to 3; most preferably, of 2 to 2.5) as indicated by a zeta potential of >1 mV.

Preferably, in the method of polishing a substrate of the present invention, the chemical mechanical polishing composition provided contains, as an initial component, a colloidal silica abrasive having a permanent positive surface charge, wherein the colloidal silica abrasive has an average particle size≤100 nm (preferably, 5 to 100 nm; more preferably, 10 to 60 nm; most preferably, 20 to 60 nm) as measured by dynamic light scattering techniques.

Preferably, in the method of polishing a substrate of the present invention, the chemical mechanical polishing composition provided contains 0.01 to 10 wt % (preferably 0.05 to 7.5 wt %; more preferably, 0.1 to 5 wt %; most preferably, 0.2 to 2 wt %) of a colloidal silica abrasive having a permanent positive surface charge.

The term permanent positive surface charge as used herein is meant that the positive charge on the silica particles is not readily reversible. That is, the positive charge on the silica particles is not reversed through flushing, dilution or filtration. A permanent positive charge can be the result, for example, of covalently bonding a cationic species to the colloidal silica particles. Colloidal silica having a permanent positive charge is in contrast to colloidal silica having a readily reversible positive charge, which can be the result of an electrostatic interaction between a cationic species and the colloidal silica.

Preferably, in the method of polishing a substrate of the present invention, the chemical mechanical polishing composition provided contains, as an initial component, a carboxylic acid. More preferably, in the method of polishing a substrate of the present invention, the chemical mechanical polishing composition provided contains, as an initial component, a carboxylic acid, wherein the carboxylic acid is a dicarboxylic acid. Still more preferably, in the method of polishing a substrate of the present invention, the chemical mechanical polishing composition provided contains, as an initial component, a carboxylic acid; wherein the carboxylic acid is a dicarboxylic acid selected from the group consisting of propanedioic acid (aka malonic acid) and 2-hydroxypropanedioic acid (aka tartronic acid). Most preferably, in the method of polishing a substrate of the present invention, the chemical mechanical polishing composition provided contains, as an initial component, a dicarboxylic acid, wherein the dicarboxylic acid is propanedioic acid.

Preferably, in the method of polishing a substrate of the present invention, the chemical mechanical polishing composition provided contains, as an initial component, 100 to 10,000 ppm (more preferably, 500 to 5,000 ppm; still more preferably, 750 to 2,500 ppm; most preferably, 1,000 to 2,000 ppm) by mass of a carboxylic acid. More preferably, in the method of polishing a substrate of the present invention, the chemical mechanical polishing composition provided contains, as an initial component, 100 to 10,000 ppm (more preferably, 500 to 5,000 ppm; still more preferably, 750 to 2,500 ppm; most preferably, 1,000 to 2,000 ppm) by mass of a carboxylic acid; wherein the carboxylic acid is a dicarboxylic acid selected from the group consisting of propanedioic acid and 2-hydroxypropanedioic acid. Most preferably, in the method of polishing a substrate of the present invention, the chemical mechanical polishing composition provided contains, as an initial component, 100 to 10,000 ppm (more preferably, 500 to 5,000 ppm; still more preferably, 750 to 2,500 ppm; most preferably, 1,000 to 2,000 ppm) by mass of a carboxylic acid; wherein the carboxylic acid is a dicarboxylic acid, wherein the dicarboxylic acid is propanedioic acid.

Preferably, in the method of polishing a substrate of the present invention, the chemical mechanical polishing composition provided has a pH of 1 to 6. More preferably, in the method of polishing a substrate of the present invention, the chemical mechanical polishing composition provided has a pH of 1 to 4. Still more preferably, in the method of polishing a substrate of the present invention, the chemical mechanical polishing composition provided has a pH of 1.5 to 3.5. Most preferably, in the method of polishing a substrate of the present invention, the chemical mechanical polishing composition provided has a pH of 2.0 to 2.5.

Preferably, in the method of polishing a substrate of the present invention, the chemical mechanical polishing composition provided optionally contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Preferably, in the method of polishing a substrate of the present invention, the chemical mechanical polishing pad provided can by any suitable polishing pad known in the art. One of ordinary skill in the art will know to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

Preferably, in the method of polishing a substrate of the present invention, the chemical mechanical polishing composition provided has a removal rate selectivity for tungsten (W) versus titanium (Ti); wherein the tungsten (W) removal rate is ≥35 (preferably, ≥500; more preferably, ≥800; most preferably ≥1,000) times higher than the titanium (Ti) removal rate. More preferably, in the method of the present invention, the chemical mechanical polishing composition provided has a removal rate selectivity for tungsten (W) versus titanium (Ti); wherein the tungsten (W) removal rate is ≥500 Å/min (more preferably, ≥1,000 Å/min; still more preferably, ≥1,500 Å/min; most preferably, ≥2,000 Å/min); wherein the titanium (Ti) removal rate is less than ≤100 Å/min; and, wherein the tungsten (W) removal rate is ≥35 (preferably, ≥500; more preferably, ≥800; most preferably ≥1,000) times higher than the titanium (Ti) removal rate. Most preferably, in the method of polishing a substrate of the present invention, the chemical mechanical polishing composition provided has a removal rate selectivity for tungsten (W) versus titanium (Ti); wherein the tungsten (W) removal rate is ≥1,000 Å/min (more preferably, ≥1,500 Å/min; most preferably, ≥2,000 Å/min); wherein the titanium (Ti) removal rate is ≤100 Å/min (more preferably, ≤50 Å/min; most preferably, ≤25 Å/min); wherein the tungsten (W) removal rate is ≥35 (preferably, ≥500; more preferably, ≥800; most preferably ≥1,000) times higher than the titanium (Ti) removal rate with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Preferably, in the method of polishing a substrate of the present invention, the tungsten (W) removal rate is ≥500 Å/min (more preferably, ≥1,000 Å/min; still more preferably, ≥1,500 Å/min; most preferably, ≥2,000 Å/min). More preferably, in the method of polishing a substrate of the present invention, the tungsten (W) removal rate is ≥1,000 Å/min (still more preferably, ≥1,500 Å/min; most preferably, ≥2,000 Å/min). Still more preferably, in the method of polishing a substrate of the present invention, the tungsten (W) removal rate is ≥1,000 Å/min (more preferably, ≥1,500 Å/min; most preferably, ≥2,000 Å/min). Most preferably, in the method of polishing the substrate of the present invention, the tungsten (W) removal rate is ≥1,000 Å/min (more preferably, ≥1,500 Å/min; most preferably, ≥2,000 Å/min) with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Preferably, in the method of polishing a substrate of the present invention, the titanium (Ti) removal rate is ≤100 Å/min (more preferably, ≤50 Å/min; most preferably, ≤25 Å/min). More preferably, in the method of polishing a substrate of the present invention, the titanium (Ti) removal rate is ≤100 Å/min (more preferably, ≤50 Å/min; most preferably, ≤25 Å/min). Most preferably, in the method of polishing the substrate of the present invention, the titanium (Ti) removal rate is ≤100 Å/min (more preferably, ≤50 Å/min; most preferably, ≤25 Å/min) with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

Some embodiments of the present invention will now be described in detail in the following Examples.

Comparative Examples C1-C8 and Examples 1-3

Chemical Mechanical Polishing Composition Preparation

The chemical mechanical polishing compositions of Comparative Examples C1-C8 and Examples 1-3 were prepared by combining the components in the amounts listed in TABLE 1 with 362 ppm $Fe(NO_3)_3$; 1,320 ppm malonic acid; 2.0 wt % hydrogen peroxide; and the balance being deionized water, adjusting the pH of the compositions to 2.3 with potassium hydroxide or nitric acid.

TABLE 1

| Ex # | Abrasive (ppm) I* | Abrasive (ppm) II** | PAH-HCl*** (ppm) | PAH**** (ppm) |
|---|---|---|---|---|
| C1 | 6,000 | — | — | — |
| C2 | — | 20,000 | — | — |
| C3 | 6,000 | — | 100 | — |
| C4 | — | 20,000 | 50 | — |
| C5 | — | 20,000 | 100 | — |
| C6 | 6,000 | — | — | 50 |
| C7 | 6,000 | — | — | 80 |
| C8 | 10,000 | — | — | 80 |
| 1 | 6,000 | — | 50 | — |
| 2 | 6,000 | — | — | 20 |
| 3 | 10,000 | — | — | 50 |

*Abrasive I—Colloidal silica abrasive having a permanent positive surface charge available from Fuso Chemical Co., Ltd.
**Abrasive II—Klebosol™ II 1598-B25 colloidal silica abrasive having a negative surface charge manufactured by AZ Electronic Materials, available from The Dow Chemical Company.
***PAH—HCl-poly(allylamine hydrochloride) having a weight average molecular weight of 58,000 Daltons available from Sigma-Aldrich Co. LLC.
****PAH—poly(allylamine) having a weight average molecular weigh of 17,000 Daltons available from Sigma-Aldrich Co. LLC.

Comparative Examples PC1-PC8 and Example P1-P3

Chemical Mechanical Polishing Removal Rate Experiments

Removal rate polishing tests were performed in Comparative Examples PC1-PC8 and Examples P1-P3 using the chemical mechanical polishing compositions prepared according to Comparative Examples C1-C8 and Examples 1-3, respectively. The polishing removal rate experiments were performed on 200 mm blanket wafers installed on an Applied Materials 200 mm Mirra® polishing machine. The polishing removal rate experiments were performed on 200 mm blanket 15 kÅ thick tetraethylorthosilicate (TEOS) sheet wafers from Novellus; tungsten (W) and titanium (Ti) blanket wafers available from Wafernet. All polishing experiments were performed using an IC1010™ polyurethane polishing pad paired with an SP2310 subpad (commercially available from Rohm and Haas Electronic Materials CMP Inc.) with a down force of 21.4 kPa (3.1 psi), a chemical mechanical polishing composition flow rate of 125 mL/min, a table rotation speed of 80 rpm and a carrier rotation speed of 81 rpm. A diamond pad conditioner PDA33A-D (commercially available from Kinik Company) was used to condition the polishing pad. The polishing pad was broken in with the conditioner using a conditioning down force of 9 lbs (4.1 kg) for 15 minutes followed by a conditioning down force of 7 lbs (3.18 kg) for an additional 15 minutes with a table speed of 80 rpm and a conditioner speed of 36 rpm. The polishing pad was further conditioned ex situ prior to polishing using a down force of 7 lbs (3.18 kg) for 24 seconds between polish experiments. The TEOS removal rates were determined by measuring the film thickness before and after polishing using a KLA-Tencor FX200 metrology tool. The tungsten (W) and titanium (Ti) removal rates were determined using a KLA-Tencor RS100C metrology tool. The results of the removal rate experiments are provided in TABLE 2.

TABLE 2

| Ex # | Slurry Composition | W (Å/min) | Ti (Å/min) | TEOS (Å/min) | W/Ti Selectivity |
|---|---|---|---|---|---|
| PC1 | Comp. Ex. C1 | 2,807 | — | 500 | — |
| PC2 | Comp. Ex. C2 | 1,912 | — | 206 | — |
| PC3 | Comp. Ex. C3 | 76 | 2 | 264 | 38 |
| PC4 | Comp. Ex. C4 | 2,058 | 1165 | 198 | 2 |
| PC5 | Comp. Ex. C5 | 2,029 | 671 | 199 | 3 |
| PC6 | Comp. Ex. C6 | 261 | 18 | 281 | 15 |
| PC7 | Comp. Ex. C7 | 92 | 3 | 296 | 31 |
| PC8 | Comp. Ex. C8 | 92 | 19 | 336 | 5 |
| P1 | Ex. 1 | 1,529 | 1 | 262 | 1529 |
| P2 | Ex. 2 | 2,647 | 3 | 326 | 882 |
| P3 | Ex. 3 | 1,194 | 33 | 501 | 36 |

We claim:

1. A method of polishing a substrate, comprising:
providing the substrate, wherein the substrate comprises tungsten (W) and titanium (Ti);
providing a chemical mechanical polishing composition, consisting of, as initial components:
water;
an oxidizing agent;
an allylamine additive selected from the group consisting of poly(allylamine hydrochloride) and poly(allylamine);
a colloidal silica abrasive having a permanent positive surface charge;
a carboxylic acid;
a source of iron (III) ions; and,
optionally, a pH adjusting agent; and wherein the chemical mechanical polishing composition has a pH of 1 to 4;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate;
wherein at least some of the tungsten (W) is polished away from the substrate at a tungsten (W) removal rate;
wherein at least some of the titanium (Ti) is polished away from the substrate at a titanium (Ti) removal rate;
wherein the chemical mechanical polishing composition provided has a removal rate selectivity for the tungsten (W) versus the titanium (Ti); and, wherein the tungsten (W) removal rate is ≥35 times higher than the titanium (Ti) removal rate.

2. The method of claim 1, wherein the tungsten (W) removal rate is ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

3. The method of claim 2, wherein the titanium (Ti) removal rate is ≤50 Å/min and wherein the tungsten (W) removal rate is ≥35 times higher than the titanium (Ti) removal rate.

4. The method of claim 1, wherein the chemical mechanical polishing composition, provided consists of, as initial components:
the water;
0.01 to 10 wt % of the oxidizing agent, wherein the oxidizing agent is hydrogen peroxide;
0.01 to 10 wt % of the colloidal silica abrasive;
the allylamine additive, wherein the allylamine additive is poly(allylamine hydrochloride) and wherein the mass ratio of the colloidal silica abrasive to the allylamine additive is ≥100;
500 to 5,000 ppm by mass by mass of the carboxylic acid, wherein the carboxylic acid is propanedioic acid;
100 to 1,000 ppm by mass of the source of iron (III) ions, wherein the source of iron (III) ions is ferric nitrate nonahydrate; and,
optionally, the pH adjusting agent; and,
wherein the chemical mechanical polishing composition has the pH of 1 to 4.

5. The method of claim 4, wherein the tungsten (W) removal rate is ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

6. The method of claim 5, wherein the titanium (Ti) removal rate is ≤25 Å/min and wherein the tungsten (W) removal rate is ≥500 times higher than the titanium (Ti) removal rate.

7. The method of claim 1, wherein the chemical mechanical polishing composition, provided consists of, as initial components:
the water;
0.01 to 10 wt % of the oxidizing agent, wherein the oxidizing agent is hydrogen peroxide;
0.01 to 10 wt % of the colloidal silica abrasive;
the allylamine additive, wherein the allylamine additive is poly(allylamine) and wherein the mass ratio of the colloidal silica abrasive to the allylamine additive is ≥150;
500 to 5,000 ppm by mass of the carboxylic acid, wherein the carboxylic acid is propanedioic acid;
100 to 1,000 ppm by mass of the source of iron (III) ions, wherein the source of iron (III) ions is ferric nitrate; and,
optionally, the pH adjusting agent; and,
wherein the chemical mechanical polishing composition has the pH of 1 to 4.

8. The method of claim 7, wherein the tungsten (W) removal rate is ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

9. The method of claim 8, wherein the titanium (Ti) removal rate is ≤50 Å/min and wherein the tungsten (W) removal rate is ≥35 times higher than the titanium (Ti) removal rate.

10. The method of claim 8, wherein the titanium (Ti) removal rate is ≤5 Å/min and wherein the tungsten (W) removal rate is ≥500 times higher than the titanium (Ti) removal rate.

* * * * *